US010056261B2

(12) United States Patent
Zhu et al.

(10) Patent No.: US 10,056,261 B2
(45) Date of Patent: Aug. 21, 2018

(54) P TYPE MOSFET

(71) Applicant: Institute of Microelectronics, Chinese Academy of Sciences, Beijing (CN)

(72) Inventors: Huilong Zhu, Poughkeepsie, NY (US); Qiuxia Xu, Beijing (CN); Yanbo Zhang, Beijing (CN); Hong Yang, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 47 days.

(21) Appl. No.: 14/385,101

(22) PCT Filed: Dec. 7, 2012

(86) PCT No.: PCT/CN2012/086173
§ 371 (c)(1),
(2) Date: Sep. 12, 2014

(87) PCT Pub. No.: WO2014/082342
PCT Pub. Date: Jun. 5, 2014

(65) Prior Publication Data
US 2015/0041925 A1 Feb. 12, 2015

(30) Foreign Application Priority Data
Nov. 30, 2012 (CN) .......................... 2012 1 0506506

(51) Int. Cl.
*H01L 21/28* (2006.01)
*H01L 21/266* (2006.01)
(Continued)

(52) U.S. Cl.
CPC ...... *H01L 21/28008* (2013.01); *H01L 21/265* (2013.01); *H01L 21/266* (2013.01);
(Continued)

(58) Field of Classification Search
CPC ............. H01L 21/28194; H01L 29/513; H01L 29/517; H01L 29/518; H01L 21/28202
See application file for complete search history.

(56) References Cited

U.S. PATENT DOCUMENTS 6,727,129 B1  4/2004  Nakajima
8,222,099 B2  7/2012  Wang et al.
(Continued)

FOREIGN PATENT DOCUMENTS

CN  1499612 A  5/2004
CN  1551300 A  12/2004
(Continued)

OTHER PUBLICATIONS

"International Application Serial No. PCT/CN2012/086173, International Search Report dated Sep. 5, 2013", 5 pgs.
(Continued)

*Primary Examiner* — Kenneth Parker
*Assistant Examiner* — Long H Le
(74) *Attorney, Agent, or Firm* — Schwegman Lundberg & Woessner, P.A.

(57) ABSTRACT

Provided are P type MOSFETs and methods for manufacturing the same. The method may include forming source/drain regions in a semiconductor substrate; forming an interfacial oxide layer on the semiconductor substrate; forming a high K gate dielectric layer on the interfacial oxide layer; forming a first metal gate layer on the high K gate dielectric layer; implanting dopants into the first metal gate layer through conformal doping; and performing annealing to change an effective work function of a gate stack including the first metal gate layer, the high K gate dielectric, and the interfacial oxide layer.

4 Claims, 6 Drawing Sheets

(51) Int. Cl.
*H01L 29/78* (2006.01)
*H01L 29/49* (2006.01)
*H01L 29/51* (2006.01)
*H01L 29/66* (2006.01)
*H01L 21/265* (2006.01)
*H01L 21/268* (2006.01)

(52) U.S. Cl.
CPC .. *H01L 21/28088* (2013.01); *H01L 21/28167* (2013.01); *H01L 29/495* (2013.01); *H01L 29/4966* (2013.01); *H01L 29/4983* (2013.01); *H01L 29/51* (2013.01); *H01L 29/513* (2013.01); *H01L 29/6659* (2013.01); *H01L 29/66545* (2013.01); *H01L 29/78* (2013.01); *H01L 29/7833* (2013.01); *H01L 21/268* (2013.01); *H01L 21/26513* (2013.01); *H01L 29/517* (2013.01)

(56) References Cited

U.S. PATENT DOCUMENTS

| | | | |
|---|---|---|---|
| 8,507,991 B2 | 8/2013 | Wang | |
| 2004/0106261 A1* | 6/2004 | Huotari | H01L 21/28088 438/287 |
| 2005/0280083 A1* | 12/2005 | Vogelsang | H01L 27/0925 257/338 |
| 2006/0273384 A1* | 12/2006 | Hshieh | H01L 24/26 257/330 |
| 2010/0038725 A1* | 2/2010 | Chudzik | H01L 21/28079 257/392 |
| 2010/0052074 A1* | 3/2010 | Lin | H01L 21/823807 257/407 |
| 2010/0123218 A1* | 5/2010 | Tada | H01L 21/02422 257/616 |
| 2010/0127336 A1* | 5/2010 | Chambers | H01L 21/28088 257/369 |
| 2011/0156154 A1* | 6/2011 | Hoentschel | H01L 21/28079 257/369 |
| 2012/0049297 A1 | 3/2012 | Takeoka | |
| 2012/0061773 A1* | 3/2012 | Tsuchiya | H01L 21/28167 257/411 |
| 2012/0280288 A1 | 11/2012 | Ando et al. | |
| 2012/0292715 A1* | 11/2012 | Hong | H01L 21/845 257/392 |
| 2013/0099328 A1 | 4/2013 | Xu et al. | |

FOREIGN PATENT DOCUMENTS

| | | |
|---|---|---|
| CN | 1846313 A | 10/2006 |
| CN | 102110650 | 6/2011 |
| CN | 102254805 A | 11/2011 |
| CN | 102280376 A1 | 12/2011 |
| CN | 102339858 A | 2/2012 |
| WO | WO-2014/082342 A1 | 6/2014 |

OTHER PUBLICATIONS

"Chinese Application Serial No. 201210506506.0, Office Action dated Jan. 14, 2016", w/ English Translation, 16 pgs.
"Chinese Application Serial No. 201210506506.0, Office Action dated Dec. 7, 2016", w/English Translation, (Dec. 7, 2016), 16 pgs.

* cited by examiner

US 10,056,261 B2

P TYPE MOSFET

CROSS-REFERENCE TO RELATED APPLICATION

This application is a US National Stage application of PCT Application No. PCT/CN2012/086173, filed on Dec. 7, 2012, entitled "P TYPE MOSFET AND METHOD FOR MANUFACTURING THE SAME," which claims priority to Chinese Application No. 201210506506.0, filed on Nov. 30, 2012. Both the PCT Application and the Chinese Application are incorporated herein by reference in their entireties.

TECHNICAL FIELD

The present disclosure relates to the semiconductor technology, and particularly to P type MOSFETs including metal gate and high K gate dielectric and methods for manufacturing the same.

BACKGROUND

As the development of the semiconductor technology, Metal Oxide Semiconductor Field Effect Transistors (MOSFETs) have their feature sizes being decreased continuously. The decrease in size of the MOSFETs causes a severe problem of gate current leakage. The gate leakage current can be reduced by using a high K gate dielectric layer, which may have an increased physical thickness with respect to a given equivalent oxide thickness (EOT). Unfortunately, a conventional Poly-Si gate is incompatible with the high K gate dielectric layer. By using a combination of a metal gate and the high K gate dielectric layer, it is possible not only to avoid the depletion effect of the Poly-Si gate and decrease gate resistance, but also to avoid boron penetration and enhance device reliability. Therefore, the combination of the metal gate and the high K gate dielectric layer is widely used in the MOSFETs. However, integration of the metal gate and the high K gate dielectric layer is still confronted with many challenges, such as thermal stability and interfacial states. Particularly, due to the Fermi-Pinning Effect, it is difficult for the MOSEFTs using the metal gate and the high K gate dielectric layer to have an adequately low threshold voltage.

To obtain an appropriate threshold voltage, a P type MOSFET should have its effective work function near the bottom of the conduction band of Si (about 5.2 eV). It is desired to select an appropriate combination of a metal gate and a high-K gate dielectric layer for the P type MOSFET, so as to achieve the desired threshold voltage. However, it is difficult to obtain such a high effective work function simply by altering materials.

SUMMARY

The present disclosure intends to provide, among others, an improved P type MOSFET and a method for manufacturing the same, by which it is possible to adjust an effective work function of the P type MOSFET during manufacture thereof.

According to an aspect of the present disclosure, a method for manufacturing a P type MOSFET is provided, comprising: forming source/drain regions in a semiconductor substrate; forming an interfacial oxide layer on the semiconductor substrate; forming a high K gate dielectric layer on the interfacial oxide layer; forming a first metal gate layer on the high K gate dielectric layer; implanting dopants to the first metal gate layer through conformal doping; and performing annealing to change an effective work function of a gate stack comprising the first metal gate layer, the high K gate dielectric layer, and the interfacial oxide layer. In a preferred embodiment, dopants for increasing the effective work function are implanted to the first metal gate layer of the P type MOSFET.

According to another aspect of the present disclosure, a P type MOSFET is provided, comprising: source/drain regions in a semiconductor substrate; an interfacial oxide layer on the semiconductor substrate; a high K gate dielectric layer on the interfacial oxide layer; and a first metal gate layer on the high K gate dielectric layer, wherein dopants are distributed at an upper interface between the high K gate dielectric layer and the first metal gate layer as well as at a lower interface between the high K gate dielectric layer and the interfacial oxide layer, and generate electrical dipoles at the lower interface through an interfacial reaction, to change an effective work function of a gate stack comprising the first metal gate layer, the high K gate dielectric layer, and the interfacial oxide layer.

In accordance with the present disclosure, the dopants accumulated at the upper interface of the high K gate dielectric can change characteristics of the metal gate, thereby adjusting the effective work function of the P type MOSFET advantageously. On the other hand, the dopants accumulated at the lower interface of the high K gate dielectric layer can generate the electrical dipoles of proper polarity through the interfacial reaction, thereby further adjusting the effective work function of the P type MOSFET advantageously. The P type MOSFET obtained by the method presents excellent stability and ability to adjustment of the effective work function of the metal gate.

BRIEF DESCRIPTION OF THE DRAWINGS

For better understanding, the present disclosure will be described in detail with reference to the drawings, in which.

DETAILED DESCRIPTION

The present invention will be described in more details below with reference to the accompanying drawings. In the following description, like components are indicated with like or similar reference signs. The drawings are not drawn to scale, for the sake of clarity.

In the following description, some specific details are set forth, such as structures, materials, sizes, and treatment processes and technologies of devices, in order to provide a thorough understanding of the present disclosure. However, it will be understood by those of ordinary skill in the art that the present disclosure may be practiced without these specific details. Each portion of a semiconductor device may comprise materials well known to those of ordinary skill in the art, or materials having similar functions to be developed in future, unless noted otherwise.

In the present disclosure, the term "semiconductor structure" refers to a semiconductor substrate and all layers or regions formed on the semiconductor substrate obtained after some operations during a process of manufacturing a semiconductor device. The term "source/drain region" refers to either a source region or a drain region of a MOSFET, and both of the source region and the drain region are labeled with a single reference sign. The term "positive dopant" refers to a dopant applicable to a P type MOSFET to reduce its effective work function.

A method for manufacturing a P type MOSFET according to an embodiment of the present disclosure will be illustrated with reference to FIGS. 1 to 11, which show sectional views of respective semiconductor structures at various stages of the method.

Figure 1:
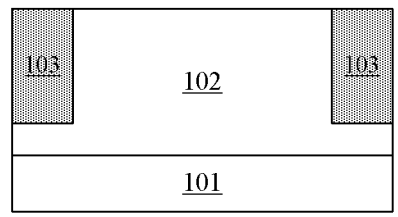
FIGS. 1 to 11 schematically shows sectional views of respective semiconductor structures during respective stages of a method for manufacturing an P type MOSFET according to an embodiment of the present disclosure.

FIG. 1 shows a semiconductor structure, which has gone through part of CMOS processes. Specifically, an N well 102 for a P type MOSFET is formed to a depth in a semiconductor substrate 101 (e.g., a Si substrate). In FIG. 1, the N well 102 is shown in a rectangular shape. In practice, the N well 102 may not have a clear boundary, and may be isolated by a portion of the semiconductor substrate 101. A shallow trench isolation 103 defines an active region for the P-type MOSFET.

Figure 2:
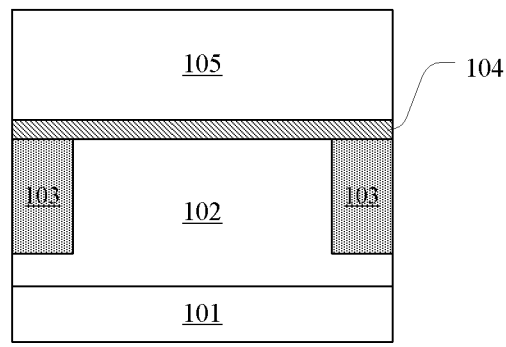

Then, a dummy gate dielectric layer 104 (e.g., silicon oxide, or silicon nitride) may be formed on the surface of the semiconductor structure through known deposition processes, such as Electron Beam evaporation (EBM), Chemical Vapor Deposition (CVD), Atomic Layer Deposition (ALD), or sputtering. In an example, the dummy gate dielectric layer 104 is a layer of silicon oxide having a thickness of about 0.8-1.5 nm. A dummy gate conductor 105 (e.g., poly-silicon, or amorphous silicon (a-Si)) is further formed on a surface of the dummy gate dielectric layer 104 through any of the above deposition processes, as shown in FIG. 2.

Thereafter, a photoresist layer PR1 is formed on the dummy gate dielectric layer 104 through, for example, spin coating. The photoresist layer PR1 is patterned to define a shape (e.g., strip) of a gate stack through a photolithographic process including exposure and development.

Figure 3:
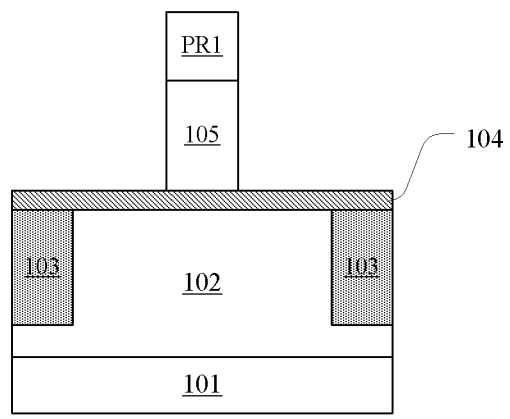

As shown in FIG. 3, exposed portions of the dummy gate conductor 105 are selectively removed using the photoresist layer PR1 as a mask through dry etching (e.g., ion milling etching, plasma etching, reactive ion etching, or laser ablation) or wet etching using an etchant solution, to form a dummy gate conductor 105 for the P type MOSFET. In the example of FIG. 3, the dummy gate conductor 105 of the P type MOSFET is in the strip pattern, but the dummy gate conductor 105 may be in other shapes.

Next, the photoresist layer PR1 may be removed by dissolution in a solvent or ashing. The dummy gate conductor 105 is employed as a hard mask to implement ion implantation to form extension regions of the P type MOSFET. In a preferred example, ion implantation may be further implemented to form halo regions for the P type MOSFET.

A nitride layer may be formed on the surface of the semiconductor structure through any of the above deposition processes. In an example, the nitride layer is a silicon nitride layer having a thickness of about 5-30 nm. A laterally-extending portion of the nitride layer is removed through anisotropic etching process (e.g., reactive ion etching), while vertical portions of the nitride layer on side surfaces of the dummy gate conductor 105 are left to form a gate spacer 106. As a result, the gate spacer 106 surrounds the dummy gate conductor 106.

Figure 4:
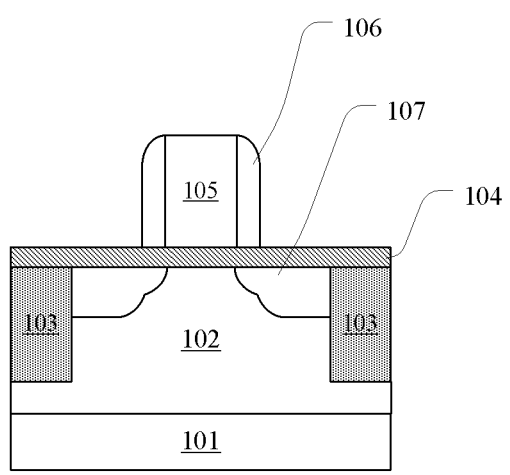

The dummy gate conductor 105 and the spacer 106 may be used as a hard mask to perform ion implantation, to form source/drain regions 107 for the P type MOSFET, as shown in FIG. 4. After the source/drain ion implantation, spike annealing and/or laser annealing may be performed to activate implanted ions at a temperature of about 1000-1100° C.

Figure 5:
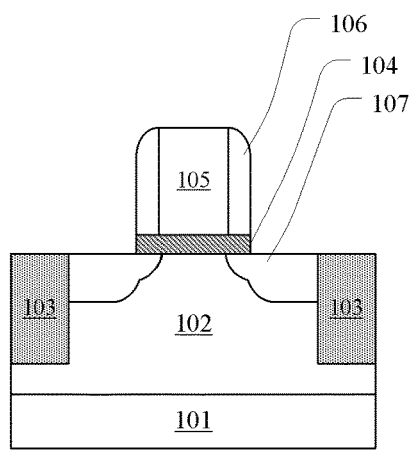

Next, by utilizing the dummy gate conductor 105 and the gate spacer 106 as a hard mask, exposed portions of the dummy gate dielectric layer 104 are selectively removed so as to expose a part of a surface of the N well 102, as shown in FIG. 5. As a result, the remaining portion of the dummy gate dielectric layer 104 is positioned below the dummy gate conductor 105.

Figure 6:
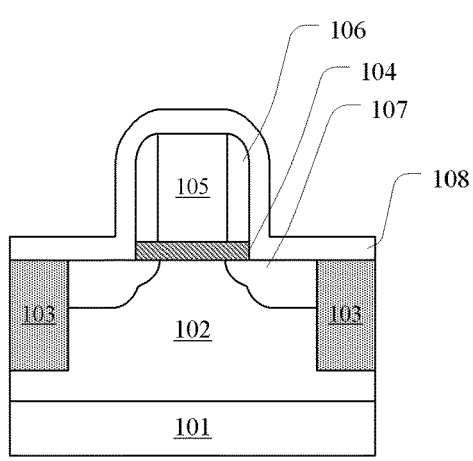

Then, a first insulating layer (e.g. silicon nitride) 108 is formed conformally on the surface of the semiconductor structure through any of the above deposition processes, as shown in FIG. 6. The first insulating layer 108 covers the dummy conductor 105 and the N well 102 of the P type MOSFET. In one example, the first insulating layer 108 is a silicon nitride layer with a thickness of about 5-30 nm.

Figure 7:
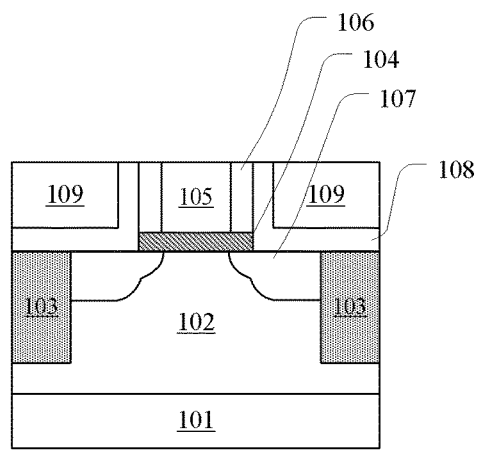

Next, a blanket second insulating layer (e.g. silicon oxide) 109 is formed on the surface of the semiconductor structure through any of the above deposition processes. The second insulating layer 109 covers the first insulating layer 108 and fills an opening between the dummy gate conductor 105. Chemical-mechanical polishing (CMP) is implemented to planarize the surface of the semiconductor structure. The CMP removes portions of the first insulating layer 108 and the second insulating layer 109 on top of the dummy gate conductor 105, and may further remove portions of the dummy gate conductor 105 and the gate spacer 106. As a result, the semiconductor structure with a substantially flat surface is obtained and the dummy gate conductor 105 is exposed, as shown in FIG. 7. The first insulating layer 108 and the second insulating layer 109 together constitute an interlayer dielectric layer.

Figure 8:
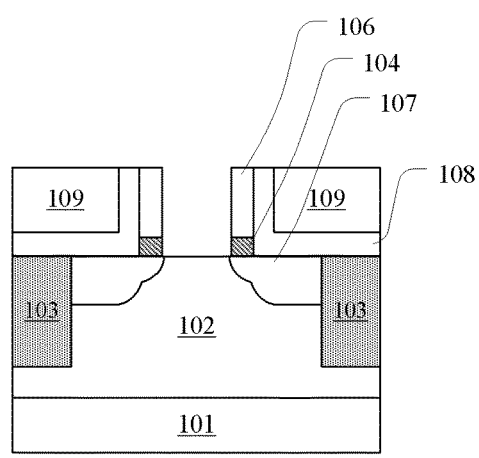

After that, the first insulating layer 108, the second insulating layer 109 and the gate spacer 106 are used as a hard mask to selectively remove the dummy gate conductor 105, and further remove the portion of the dummy gate dielectric layer 104 beneath the dummy gate conductor 105 through dry etching (e.g., ion milling etching, plasma etching, reactive ion etching, or laser ablation) or wet etching using an etchant solution, as shown in FIG. 8. In an example, the dummy gate conductor 105 is formed of poly-silicon, and thus removed through wet etching using a suitable etchant (e.g., Tetramethyl ammonium hydroxide, TMAH) solution. The etching process forms a gate opening which exposes a top surface of the N well 102 of the P type MOSFET.

Next, an interfacial oxide layer 110 (e.g., silicon oxide) is formed on the exposed surface of the N well 102 of the P type MOSFET through chemical oxidation or additional thermal oxidation. In an example, the interfacial oxide layer 110 is formed through a rapid thermal oxidation process at a temperature of about 600-900° C. for about 20-120 s. In another example, the interfacial oxide layer 110 is formed by chemical oxidation in a solution containing ozone ($O_3$).

Preferably, before forming the interfacial oxide layer 110, the surface of the N well 102 of the P type MOSFET is cleaned. The cleaning includes first conducting a conventional cleaning on the semiconductor structure, immersing the semiconductor structure in a mixture solution of hydrofluoric acid, isopropanol, and water, then rinsing the semiconductor structure with deionized water, and finally spin-drying the semiconductor structure. In an example, the hydrofluoric acid, isopropanol, and water in the solution have a volume ratio of about 0.2-1.5%:0.01-0.10%:1, and the immersing is performed for about 1-10 minutes. With the cleaning process, the surface of the N well 102 of the P type MOSFET can be cleaned, thereby suppressing natural oxidation and particle contamination on the silicon surface, and thus facilitating formation of the interfacial oxide layer 110 with high quality.

Figure 9:
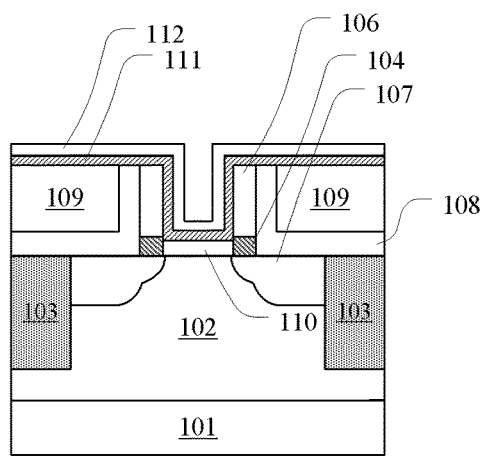

As shown in FIG. 9, a high K gate dielectric layer 111 and a first metal gate layer 112 may be formed conformally in this order on the surface of the semiconductor structure through a known deposition process, such as ALD (Atomic Layer Deposition), CVD (Chemical Vapor Deposition), MOCVD (Metal Organic Chemical Vapor Deposition), PVD (Physical Vapor Deposition), or sputtering.

The high K gate dielectric layer 111 may comprise a suitable material having a dielectric constant larger than that of $SiO_2$, such as any one selected from $ZrO_2$, ZrON, ZrSiON, HfZrO, HfZrON, HfON, $HfO_2$, HfAlO, HfAlON, HfSiO, HfSiON, HfLaO, HfLaON, or any of combinations thereof. The first metal gate layer 112 may comprise a suitable material that can be used to form a metal gate, such as any one selected from TiN, TaN, MoN, WN, TaC, or TaCN. In an example, the interfacial oxide layer 110 is, for example, a layer of silicon oxide with a thickness of about 0.2-0.8 nm. The high K gate dielectric layer 111 is, for example, a layer of $HfO_2$ with a thickness of about 2-5 nm, and the first metal gate layer 112 is, for example, a layer of TiN with a thickness of about 1-10 nm.

Preferably, post deposition annealing of the high K gate dielectric layer may be included between forming the high K gate dielectric layer 111 and forming the first metal gate layer 112, to improve the quality of the high K gate dielectric layer. This may facilitate the subsequently-formed first metal gate layer 112 to have a uniform thickness. In an example, the post deposition annealing is rapid thermal annealing at a temperature of about 500-1000° C. for about 5-100 s.

Figure 10:
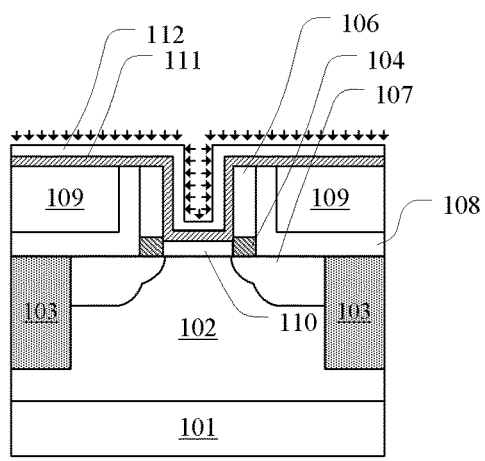

As shown in FIG. 10, positive dopants are implanted into the first metal gate layer 112 in the active region of the P type MOSFET through conformal doping. The positive dopants may be selected from In, B, $BF_2$, Ru, W, Mo, Al, Ga, or Pt. Energy and dose for the ion implantation may be controlled so that the implanted dopants are distributed in substantially only the first metal gate layer 112, without entering the high K gate dielectric layer 111. The energy and dose for the ion implantation may be further controlled so that the first metal gate layer 112 has suitable doping depth and concentration in order to achieve an expected threshold voltage. In an example, the energy for the ion implantation may be about 0.2 KeV-30 KeV, and the dose may be about 1E13-1E15 $cm^{-2}$.

Figure 11:
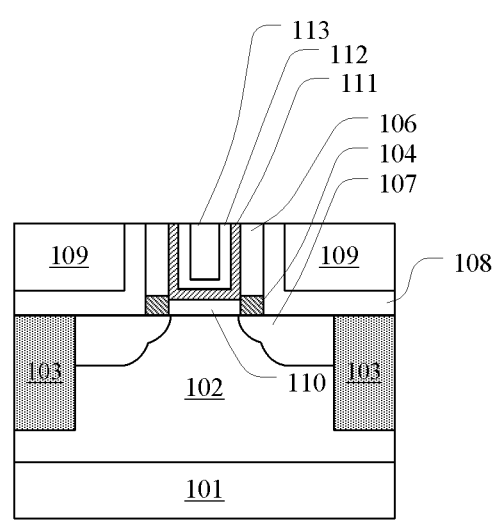

Then, a second metal gate layer 113 is formed on the surface of the semiconductor structure through any of the above known deposition processes. With the second insulating layer 109 as a stop layer, Chemical Mechanic Polishing (CMP) is performed to remove portions of the high K gate dielectric layer 111, the first metal gate layer 112, and the second metal gate layer 113 outside the gate opening, while only portions thereof inside the gate opening are left, as shown in FIG. 11. The second metal gate layer may comprise a material identical to or different from that of the first metal gate layer, such as any one selected from W, TiN, TaN, MoN, WN, TaC, or TaCN. In an example, the second metal gate layer may be a layer of W about 2-30 nm thick. As shown in the figures, a gate stack of the P type MOSFET includes the second metal gate layer 113, the first metal gate layer 112, the high K dielectric layer 111, and the interfacial oxide layer 110.

The above semiconductor structure may be subjected to annealing in an atmosphere of inert gas (e.g., $N_2$) or weak-reducibility gas (e.g., a mixture of $N_2$ and $H_2$) after the doping of the metal gate, for example, before or after forming the second metal gate layer 113. In an example, the annealing is conducted in an oven at a temperature of about 350° C.-700° C. for about 5-30 minutes. The annealing drives the implanted dopants to diffuse and accumulate at upper and lower interfaces of the high K gate dielectric layer 111, and further generate electric dipoles through interfacial reaction at the lower interface of the high K gate dielectric layer 111. Here, the upper interface of the high K gate dielectric layer 111 denotes the interface with the overlying first metal gate layer 112, and the lower interface of the high K gate dielectric layer 111 denotes the interface with the underlying interfacial oxide layer 110.

The annealing changes the distribution of the dopants. On one hand, the dopants accumulated at the upper interface of the high K gate dielectric layer 111 can change characteristics of the metal gate, and thus facilitate adjustment of the effective function work of the P type MOSFET. On the other hand, the dopants accumulated at the lower interface of the high K gate dielectric layer 111 can generate electric dipoles of suitable polarity through interfacial reaction, and thus further facilitate adjustment of the effective function work of the P type MOSFET. As a result, the effective work function of the gate stack of the P type MOSFET can be changed in a range of about 4.8 eV to 5.2 eV.

The foregoing description does not illustrate every detail for manufacturing a MOSFET, such as formation of source/drain contacts, additional interlayer dielectric layers and conductive vias. Standard CMOS processes for forming these components are well known to those of ordinary skill in the art, and thus description thereof is omitted.

The foregoing description is intended to illustrate, not limit, the present disclosure. The present disclosure is not limited to the described embodiments. Variants or modifications apparent to those skilled in the art will fall within the scope of the present disclosure.

The invention claimed is:
1. A P type MOSFET, comprising:
   source/drain regions in a semiconductor substrate;
   an interfacial oxide layer on the semiconductor substrate;
   a high K gate dielectric layer on the interfacial oxide layer; and
   a first metal gate layer of TiN on the high K gate dielectric layer, wherein the first metal gate layer is in a U shape having a laterally extending portion which extends in a direction substantially parallel to the semiconductor substrate and vertically extending portions which extend from the laterally extending portion on opposite ends of the laterally extending portion, respectively, in a direction substantially vertical to the semiconductor substrate, wherein the first metal gate layer is doped in a substantially even manner through conformal doping across the vertically extending portions and the laterally extending portion,
   wherein dopants are distributed at an upper interface between the high K gate dielectric layer and the first metal gate layer as well as at a lower interface between the high K gate dielectric layer and the interfacial oxide layer, and generate electrical dipoles at the lower interface through interfacial reaction, to change an effective work function of a gate stack comprising the first metal gate layer, the high K gate dielectric layer, and the interfacial oxide layer, and wherein the dopants are selected from a group consisting of In, B and $BF_2$.
2. The P type MOSFET according to claim 1, further comprising:
   a second metal gate layer on the first metal gate layer; and a gate spacer surrounding the interfacial oxide layer, the high K gate dielectric layer, and the first and second metal gate layers.

3. The P type MOSFET according to claim 1, further comprising:
an N type well in the semiconductor substrate, wherein the source/drain regions are located in the well.

4. The P type MOSFET according to claim 1, wherein the effective work function of the gate stack is in a range of 4.8 eV to 5.2 eV.

* * * * *